US006135787A

United States Patent [19]

Byrd et al.

[11] Patent Number: 6,135,787

[45] Date of Patent: Oct. 24, 2000

[54] CONNECTOR SHROUD FOR A PIN ARRAY

[75] Inventors: Timothy Byrd, Goffstown, N.H.; Robert A. Orlando, N. Andover, Mass.

[73] Assignee: Schneider Automation Inc., North Andover, Mass.

[21] Appl. No.: 09/185,270

[22] Filed: Nov. 3, 1998

[51] Int. Cl.[7] .............................. H01R 12/00; H05K 1/00

[52] U.S. Cl. ............................ 439/78; 439/553; 439/903

[58] Field of Search ............................. 439/78, 572, 571, 439/553

[56] References Cited

U.S. PATENT DOCUMENTS

| | | | |
|---|---|---|---|
| 3,568,001 | 3/1971 | Straus . | |
| 3,597,726 | 8/1971 | Appleton | 439/724 |
| 3,714,618 | 1/1973 | Appleton | 439/717 |
| 4,173,387 | 11/1979 | Zell . | |
| 4,597,618 | 7/1986 | Reimer . | |
| 4,761,141 | 8/1988 | Hawk et al. . | |
| 4,871,320 | 10/1989 | Mouissie | 439/78 |
| 4,960,387 | 10/1990 | Davis et al. | 439/374 |
| 4,998,887 | 3/1991 | Kaufman et al. | 439/78 |
| 5,046,956 | 9/1991 | Takano | 439/78 |
| 5,176,526 | 1/1993 | Hillbish et al. . | |
| 5,194,020 | 3/1993 | Voltz | 439/579 |
| 5,288,246 | 2/1994 | Whiteman, Jr. et al. | 439/571 |
| 5,522,730 | 6/1996 | Soes et al. | 439/78 |
| 5,634,810 | 6/1997 | Niitsu et al. . | |
| 5,655,914 | 8/1997 | McCartin et al. . | |
| 5,660,557 | 8/1997 | Lemke et al. . | |
| 5,713,755 | 2/1998 | Koopman et al. | 439/378 |
| 5,964,596 | 10/1999 | Vicich et al. | 439/78 |

OTHER PUBLICATIONS

Drawing entitled "Connector Shroud 042708055" No Date.

*Primary Examiner*—Neil Abrams
*Assistant Examiner*—Hae Moon Hyeon
*Attorney, Agent, or Firm*—Larry I. Golden; Michael J. Femal

[57] ABSTRACT

The present invention provides a device for connecting two circuit boards together. The device constitutes four side walls joined to define an aperture, a pin array disposed completely within the aperture, at least one resilient finger which acts to retain said pin array within the aperture, and a shoulder on at least one of the four side walls which prevents the pin array from passing through the aperture.

3 Claims, 3 Drawing Sheets

CONNECTOR SHROUD FOR A PIN ARRAY

TECHNICAL FIELD

This invention relates to electrical connectors. More specifically, it relates to shrouds for electrical connectors for having a pin array which interfaces two circuit boards.

BACKGROUND OF THE INVENTION

A few systems have been proposed to protect, guide and support standard pin arrays used to connect to circuit boards in a stacked arrangement.

U.S. Pat. No. 4,173,387 to Zell discloses a pin header assembly which provides shrouded protection for a pin array used to connect two circuit boards. The shroud of the device of Zell is made of two pieces. Leg means 20, 22 of a first and second member 10, 12 are used to attach the first member and a second member together and to a printed circuit board 64 having pins 66 therethrough. However, the device of Zell has a large footprint, and, therefore, electrical connectors using the device of Zell require more room. Additionally, the device of Zell does not include an alignment pin to increase the lead-in length for aligning the connectors when making a blind connection. Not using an alignment pin also causes the pins themselves to be used for alignment of the connectors, and, therefore, may cause the pins to inadvertently bend or become damaged. Finally, the device of Zell does not use standard pin arrays, but rather requires a particular pin array which includes the two bores 68, 70.

U.S. Pat. No. 5,176,526 to Hillbish et al. discloses a shielded stacking electrical connector assembly. The assembly allows stacking of two or more circuit boards on a single connector assembly that extends through each board. However, the device of Hillbish also has the problems identified above in the Zell reference, such as lack of at least the following: a shroud covering the pin array to protect from damage and inadvertent electrical contact, an alignment pin for alignment of the connectors, and the use of standard pin arrays with the connector. Additionally, the device of Hillbish does not allow the manual removal of the pin array from the connector or shroud in order to replace the pin array. In order to replace a damaged pin array of Hillbish, the entire device must be unsoldered from the circuit board.

Therefore, there is a need in the connector industry to provide a shroud for standard pin arrays which provides better protection, better alignment when mating with other circuit boards, complete encapsulation of the pin array, and use of standard pin arrays which are not soldered to the circuit and can be removed manually. The present invention is provided to solve these and other problems.

SUMMARY OF THE INVENTION

The present invention provides a device for electrically connecting two circuit boards together using a pin array. To this end, there is provided a device having a first side wall, a second side wall, a third side wall, and a fourth side wall which are joined to define an aperture.

The aperture is dimensioned such that the pin array does not protrude from the aperture and at least one resilient finger acts to resiliently retain the pin array within the aperture. The aperture is also dimensioned such that the pin array is completely or, at least, substantially contained within the aperture. Finally, a shoulder on at least one of the first, second, third, and fourth side walls, and within the aperture, prevents the pin array from passing through the aperture.

Also provided is at least one alignment pin located on one of the side walls which guides the connector and facilitates the blind connection of the two circuit boards and prevents damage to the pins of the pin array.

Also provided are extensions and raised portions located on a side wall of the shroud which act in concert with a case of a device in which the shroud is installed to provide support for the shroud and pin array to prevent the pins of the pin array from becoming bent.

Finally, cutout regions are provided, and are capable of accommodating a resilient shroud retaining finger in order to maintain the shroud in a fixed position in relation to a circuit board.

DETAILED DESCRIPTION OF THE INVENTION

Figure 1:
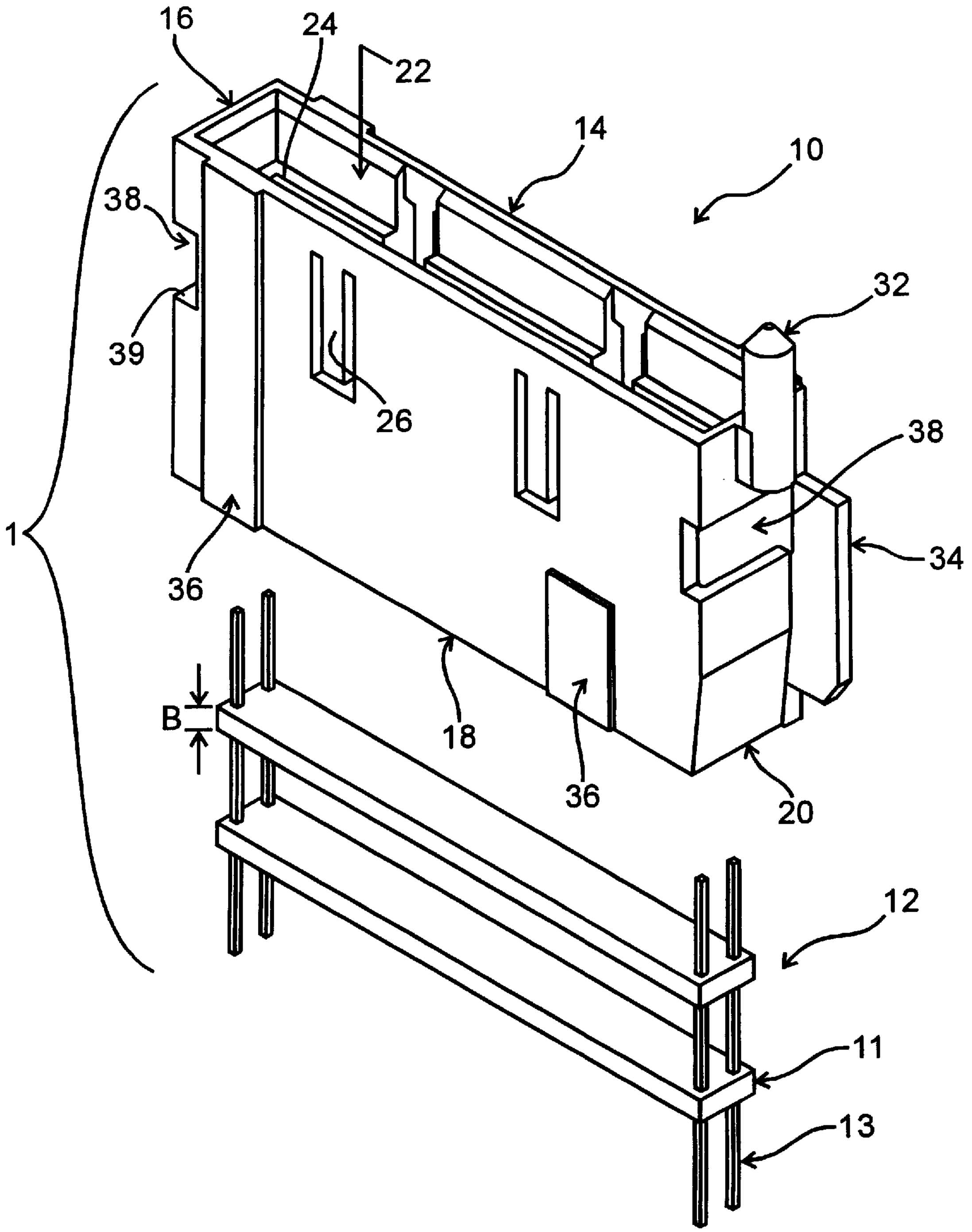
FIG. 1 is a perspective view of a shroud and pin array according to the present invention.

While the invention is susceptible of embodiment in many different forms, there is shown in the drawings and will herein be described in detail a preferred embodiment of the invention. It is to be understood that the present disclosure is to be considered only as an example of the principles of the invention. This disclosure is not intended to limit the broad aspect of the invention to the illustrated embodiments. The scope of protection should only be limited by the accompanying claims.

Referring to FIG. 1, the present invention provides a shroud for a pin array 12 of an electrical connector 1 for electrically connecting two circuits boards. The pin array 12 comprises two pin retainers 11 and a plurality of pins 13. Pin arrays are well known in the art and are readily available from a variety of manufacturers including Berg Electronics Corp. and AMP, Inc.

Figure 3:
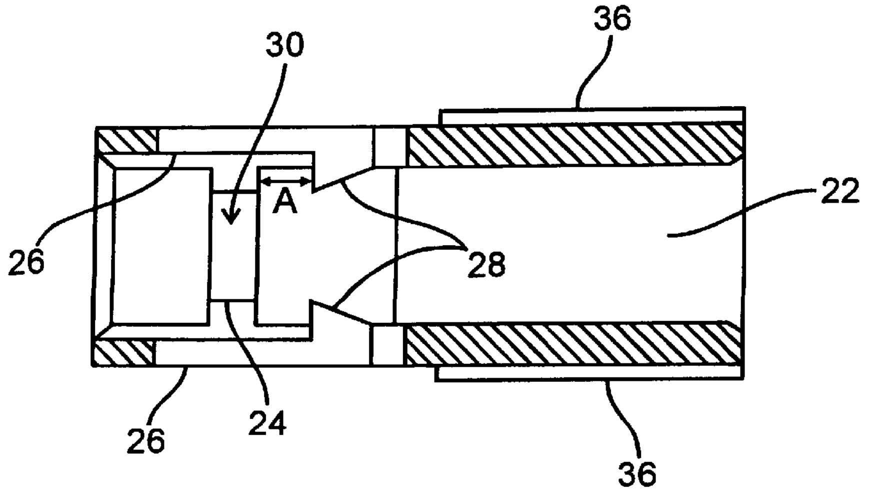
FIG. 3 is a section view of a shroud according to the present invention taken along line A—A of FIG. 2.

The shroud comprises a first side wall 14, a second side wall 16, a third side wall 18, and a fourth side wall 20. The first side wall 14, the second side wall 16, the third side wall 18, and the fourth side wall 20 together define an aperture 22. Located within the aperture 22 is a shoulder 24 which defines a shoulder opening 30 (FIG. 3). The shoulder opening 30 is dimensioned such that the pins 13 of the pin array may pass through the shoulder opening 30 but the pin retainers 11 cannot pass through the shoulder opening 30.

Figure 2:
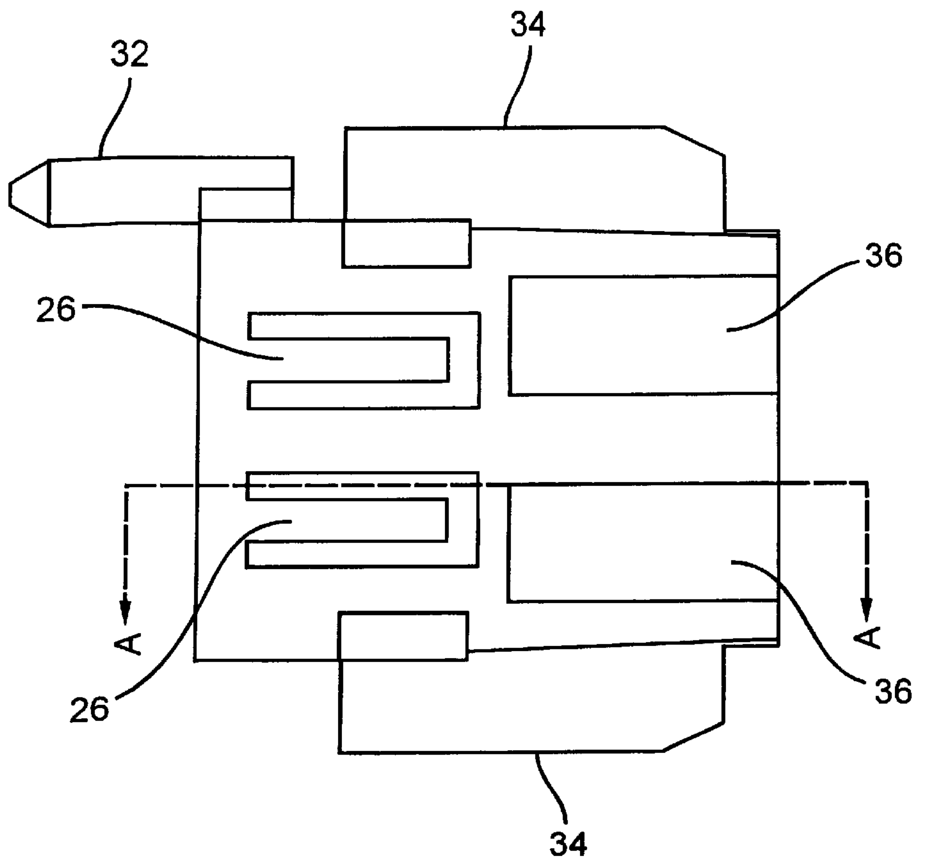
FIG. 2 is a plan view of a shroud according to the present invention.

On the first and third side walls 14, 18 are located four resilient fingers 26 which have protuberances 28 located thereon (see FIG. 2). The protuberances 28 are located on each finger 26 such that a dimension A between the protuberance 28 and the shoulder 24 is only slightly greater than a thickness (dimension B) of the pin retainer 11. The pin array 12, therefore, can be placed within the aperture 22, urged past the protuberances 28 of the resilient fingers 26, placing the pin array 12 in a fixed arrangement between the protuberances 28 and the shoulder 24. Additionally, when the pin array 10 is inserted in this manner the pins 13 do not extend outside the aperture 22.

The pin array 12 may be removed from the aperture 22 by urging the pin array 12 past the protuberances 28 of the resilient fingers 26. Alternately, the resilient fingers 26 and the protuberances 28 could be replaced by resilient fingers which fictionally hold the pin array 12 against the shoulder 24.

Located on the fourth wall 20 is an alignment pin 32 for aiding in alignment of the pin array 12 with a mating connector as described below. Additionally, extensions 34 are attached to the first side wall 14. The extensions 34 allow the shroud 10 to be optionally supported by a separate structure. Additionally, raised portions 36 are located on the first and third side walls 14, 18 of the shroud 10 and can optionally be used for alignment of the shroud 10. Primarily, however, the raised portions 36 are beneficial for ejection of the shroud 10 from a mold when the shroud 10 is made in an injection molding process.

Figure 5:
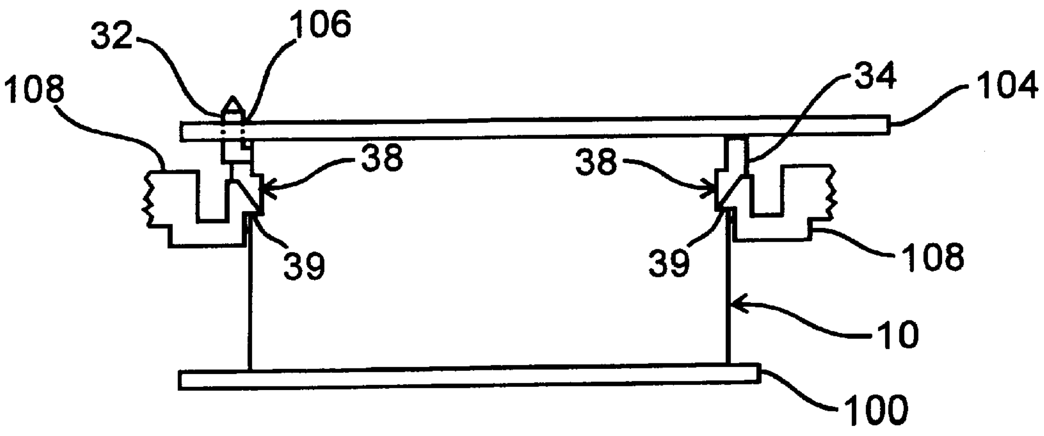
FIG. 5 is a plan view of a shroud and pin array in connection with two circuit boards according to the present invention.

Finally, cutout regions 38 are defined by the second and fourth side walls 16, 20. At one end of the cutout region, a shoulder 39 is defined. The cutout regions 38 and shoulders 39 allow for the shroud 10 to be maintained in a fixed position in relation to a circuit board as shown in FIG. 5. Resilient shroud retaining fingers 40 maintain the shroud 10 in the fixed position shown by protuberances 42 which assert a force upon the shoulders 39.

Figure 4:
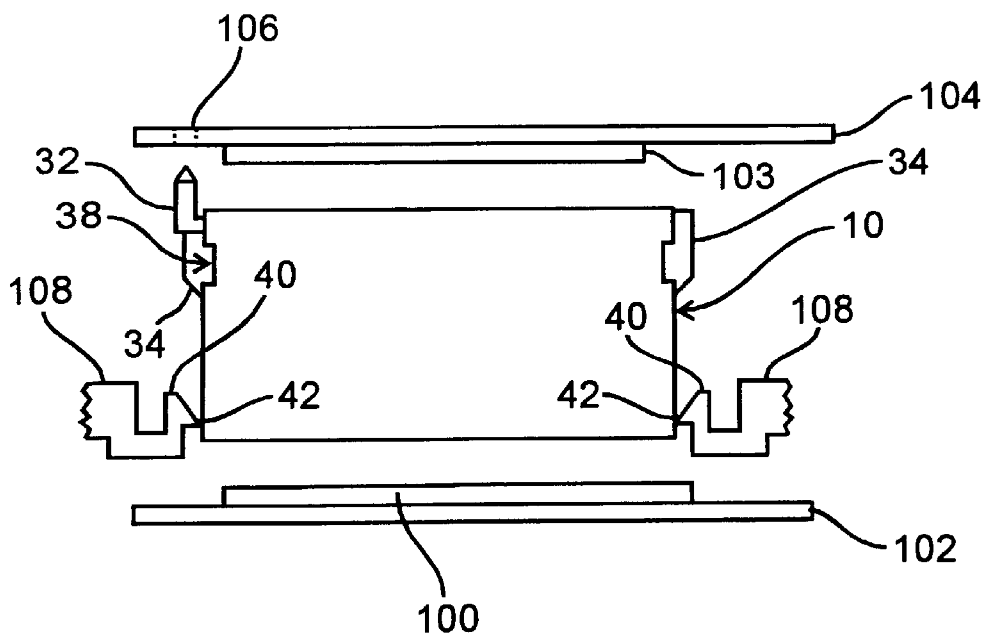
FIG. 4 is a plan view of a shroud and pin array in alignment for connection with two circuit boards according to the present invention.

Referring to FIGS. 4 and 5, the shroud 10 can be used by inserting the pin array 12 into the aperture 22 past the protuberances 28 of the fingers 26, as described above, thereby locking the pin array 12 within the shroud 10. Next, the pin array 12 and shroud 10 combination is inserted into a female connector 100 which is mounted on a first circuit board 102 by inserting the pins 13 of the pin array 12 into the female connector 100. The case (not shown) in which the circuit boards 102, 104 will be mounted may optionally contain one or more resilient shroud retaining fingers 108 which prevent the shroud 10 from becoming disassociated from the first circuit board 102 by asserting a force upon the shoulders 39.

Next the shroud 10 and pin array 12 combination is inserted into a female connector 103 which is mounted on a second circuit board 104. The second circuit board 104 defines a through-hole 106 which is designed to accept the alignment pin 32 of the shroud 10 in order to properly align the pins 13 with the female connector 103. This is especially important when the circuit boards 102, 104 are so large as to obstruct the view of the person making the connection, thereby preventing him from otherwise aligning the pins 13 with the female connector 103. Additionally, the case (not shown) may further provide surfaces for the extensions 34 to abut in order to provide additional support for the shroud 10.

While the specific embodiments have been illustrated and described, numerous modifications come to mind without significantly departing from the spirit of the invention, and the scope of protection is only limited by the scope of the accompanying claims.

We claim:

1. A shroud device for a pin array, the pin array comprising a plurality of conductors and a retainer, wherein the conductors extend through and are maintained in spaced relationship by the retainer, the shroud comprising:

a plurality of interconnected side walls defining an aperture and an exterior surface in relation to each of the side walls, the exterior surface of one of the side walls including a raised portion defining a raised surface and extended side surfaces, the raised surface having a surface area larger than the combined surface areas of the extended side surfaces;

a shoulder on one of the side walls, and within the aperture, to prevent the pin array from passing through the aperture; and a resilient finger, wherein the resilient finger and the shoulder engage the retainer of the pin array to retain the pin array within the aperture.

2. A shroud device for a pin array, the pin array comprising a plurality of conductors and a retainer, wherein the conductors extend through and are maintained in spaced relationship by the retainer, the shroud comprising:

a plurality of interconnected side walls defining an aperture;

a shoulder on one of the side walls, and within the aperture, to prevent the pin array from passing through the aperture;

a resilient finger, wherein the resilient finger and the shoulder engage the retainer of the pin array to retain the pin array within the aperture; and an elongated extension disposed on one of the side walls and oriented in a direction generally parallel to the insertion direction, the elongated extension capable of engaging a form of a separate structure to position and support the shroud in relation to the circuit board.

3. A shroud device for a pin array, the pin array comprising a plurality of conductors and a retainer, wherein the conductors extend through the retainer in an insertion direction and are maintained in spaced relationship by the retainer, the shroud comprising:

a plurality of interconnected side walls defining an aperture and an exterior surface in relation to each of the side walls, the exterior surface of one of the side walls including a raised portion defining a raised surface and extended side surfaces surface areas, the raised surface having a surface area larger than the combined surface areas of the extended side surfaces, one of the side walls having a cutout region for accommodating a resilient shroud retaining finger capable of maintaining the shroud in a fixed position in relation to a circuit board;

a shoulder disposed on one of the side walls and within the aperture to prevent the pin array from passing through the aperture when inserted into the shroud device;

a resilient finger, wherein the resilient finger and the shoulder engage the retainer of the pin array to retain the pin array within the aperture;

an alignment pin disposed on one of the exterior surfaces of the side walls and positioned in a direction generally parallel to the insertion direction; and an elongated extension disposed on one of the side walls and oriented in a direction generally parallel to the insertion direction, the elongated extension capable of engaging a form of a separate structure to position and support the shroud in relation to the circuit board.

* * * * *